United States Patent [19]  
Kooi

[11] 3,970,486  
[45] July 20, 1976

[54] METHODS OF PRODUCING A SEMICONDUCTOR DEVICE AND A SEMICONDUCTOR DEVICE PRODUCED BY SAID METHOD

[75] Inventor: Else Kooi, Eindhoven, Netherlands

[73] Assignee: U.S. Philips Corporation, New York, N.Y.

[22] Filed: Feb. 14, 1975

[21] Appl. No.: 549,936

Related U.S. Application Data

[63] Continuation of Ser. No. 672,622, Oct. 3, 1967, abandoned.

[30] Foreign Application Priority Data

Oct. 5, 1966 Netherlands .................. 6614016

[52] U.S. Cl. .............................. 148/187; 148/1.5; 357/50
[51] Int. Cl.² ............................................ H01L 21/22
[58] Field of Search ............ 148/1.5, 175, 187, 188; 317/235; 357/50, 56

[56] References Cited
UNITED STATES PATENTS

| | | | |
|---|---|---|---|
| 2,981,877 | 4/1961 | Noyce | 317/235 |
| 3,165,430 | 1/1965 | Hugle | 148/187 |
| 3,279,963 | 10/1966 | Castrucci et al. | 148/188 |
| 3,442,011 | 5/1969 | Streiter | 148/187 UX |
| 3,445,303 | 5/1969 | Engbert | 148/187 |
| 3,479,237 | 11/1969 | Bergh et al. | 148/1.5 X |
| 3,484,313 | 12/1969 | Tauchi et al. | 148/187 |
| 3,550,292 | 12/1970 | Irie et al. | 148/1.5 |
| 3,649,386 | 3/1972 | Murphy | 148/187 |
| R28,653 | 12/1975 | Murphy | 148/175 |

OTHER PUBLICATIONS

Silicon Nitride, A New Diffusion Mask, Doo, IEEE Transactions on Electron Devices, vol. 13, No. 7, pp. 561–563, July 1966.

Primary Examiner—L. Dewayne Rutledge  
Assistant Examiner—J. M. Davis  
Attorney, Agent, or Firm—Frank R. Trifari; Jack Oisher

[57] ABSTRACT

A method of making a semiconductor device is described in which a selected surface portion of a silicon wafer is masked against oxidation, and then the surface is oxidized to grow a thermal oxide which sinks into the silicon surface at the unmasked areas, with the result that the masked silicon remains as a mesa surrounded by the sunken oxide. Then semiconductor devices can be provided by various techniques in the silicon mesa. The advantages include the provision of flat junctions, as distinguished from dish junctions in the prior art, reduced capacitance resulting from the extension of the device interconnections over the silicon wafer, and a flatter surface on top of the wafer reducing the risk of damage to the deposited interconnections.

38 Claims, 13 Drawing Figures

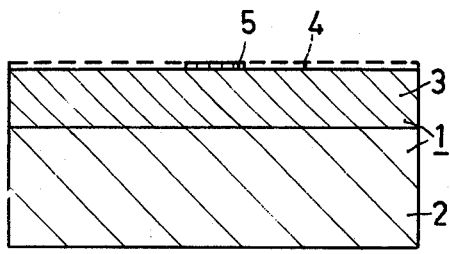
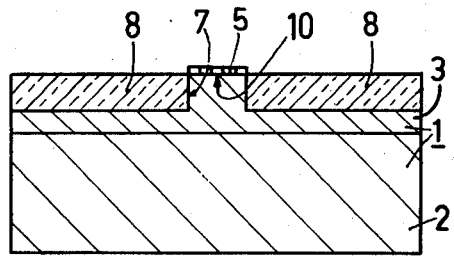
FIG. 1  FIG. 3
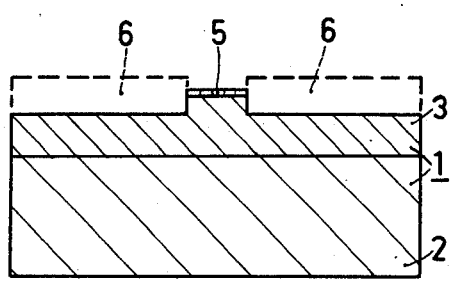
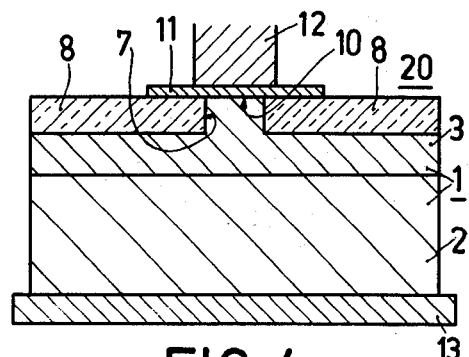
FIG. 2  FIG. 4
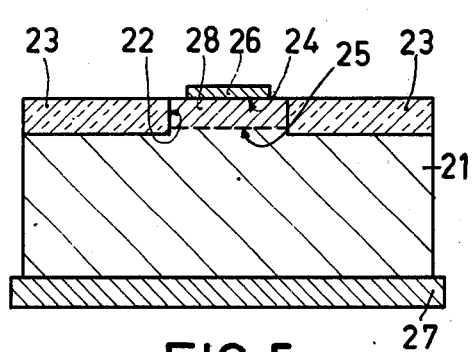
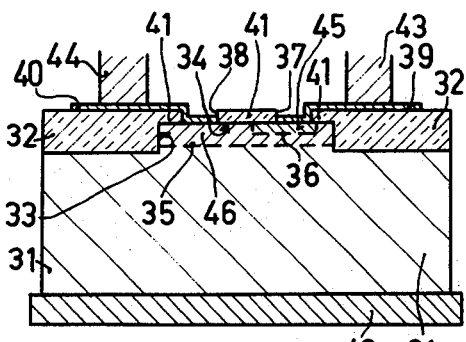
FIG. 5  FIG. 6

METHODS OF PRODUCING A SEMICONDUCTOR DEVICE AND A SEMICONDUCTOR DEVICE PRODUCED BY SAID METHOD

This is a continuation of application Ser. No. 672,622, filed Oct. 3, 1967, now abandoned.

The invention relates to a method of producing a semiconductor device comprising a semiconductor silicon body having at least one semiconductor circuit element for which a silicon oxide layer is provided adjacent the silicon body, the substantially flat silicon oxide layer being obtained by an oxidizing treatment at a surface of the silicon body and transformed into a patterned layer of silicon oxide after which the portion of the surface not covered by the patterned layer is subjected to treatments in order to obtain the circuit element. The invention relates also to a semiconductor device manufactured by the method.

Methods of this kind are often used inter alia for the manufacture of the so-called planar semiconductor devices.

The oxide layer provided for the circuit element has an essential function with respect to the circuit element.

This oxide layer may serve, for example, as an electric insulation between the silicon body and an electric conductor provided on the oxide layer and connected to a zone of the circuit element. Moreover the oxide layer may be applied to improve the surface properties of the silicon body and hence the electric properties of the circuit element in which case the oxide layer covers at least those parts of the surface of the silicon body where at least one of the pn-junction planes of the circuit element intersects the silicon surface. During the manufacture the oxide layer may serve as a mask for diffusion.

In known methods of the kind set forth portions of the applied oxide layer is locally removed so that a patterned layer of silicon oxide, i.e., an oxide pattern, is obtained. Then the portion of the silicon surface not covered by the pattern is subjected to treatments known in the semiconductor technique, for example a diffusion treatment and the application of an electric contact, in order to obtain the circuit element.

In their various uses said methods involve various difficulties. In a thin oxide layer there may be provided windows by etching with great accuracy. However, this accuracy decreases according as the oxide layers are thicker, since during etching oxide is etched off not only in the direction of thickness of the oxide layer but also in lateral directions and the lateral etching increases with an increasing thickness of the oxide layer. This lateral etching restricts the minimum obtainable dimensions of a window to be provided in the oxide layer. With respect to the accurate formation of an oxide pattern, an oxide layer of minimum thickness is desired.

However, for other reasons, a thicker oxide layer is often desired, for example, for obtaining a satisfactory insulation between a conductor to be provided on the oxide layer and the silicon body and/or to minimize the capacity between this conductor and the silicon body. Moreover a thin oxide layer is easily damaged when a lead is connected to a conductor provided on the oxide layer.

The surface of a planar semiconductor device having a silicon body with a silicon oxide layer provided with conductors is preferably as flat as possible. Irregularities are due inter alia to openings provided in the oxide layer through which openings the conductors are connected to the silicon body. At the edges of these openings irregularities and damage of the conductors may occur, the more so when these openings are provided in a thicker oxide layer.

Said advantages and disadvantages of thicker and thinner oxide layers lead in practice often to a compromise with respect to the thickness of the oxide layer in which case none of the difficulties is solved satisfactorily.

In methods of the kind set forth usually at least one pn-junction of the circuit element is obtained by diffusing an impurity into the semiconductor body through an opening in the oxide layer. Then a cup-shaped pn-junction is obtained, which is strongly curved at the edges and which is, near these edges, approximately at right angles to the surface of the silicon body and the oxide layer. This involves two disadvantages. The strong curvature of the pn-junction adversely affects the break-down voltage of the junction. Since at the edges the pn-junction is approximately at right angles to the oxide layer drift of ions on the surface of the oxide layer, which ions are practically unavoidable, may occur during the operation of the circuit element which results in instability of the circuit element. Therefore a flat pn-junction is often desirable. The invention has for its object to provide a method of the kind set forth in which the said difficulties involved in the known methods are avoided at least partly. Further advantages of the method according to the invention will be evident hereinbelow.

According to the invention a method described in the preamble is characterized in that a patterned layer of silicon oxide sunk in the silicon body over at least part of its thickness, is provided by masking the substantially flat surface of the silicon body locally against the oxidation during the oxidizing process.

Since the patterned layer of silicon oxide is sunk over at least part of its thickness in the silicon body, flatter semiconductor circuit elements can be obtained by the method according to the invention than by the known methods, even if a thick oxide layer is employed. Moreover, the silicon oxide layer is applied directly in the form of a patterned layer so that it is not necessary to etch the oxide layer for obtaining the pattern, which is an advantage as will be evident from the foregoing, particularly in the case of thick oxide layers.

For protection against oxidation preferably a layer of a material having a thickness which is smaller than that of the patterned layer of silicon oxide to be applied is used. Such a thin oxidation masking layer can be brought into the form of a patterned layer more accurately by etching or sputtering than a thicker oxide layer. It is understood that the mask pattern is the negative of the oxide pattern to be made. It is advantageous to mask the silicon body locally against oxidation by applying a layer of silicon nitride. Other masking materials may be used, for example, some metals such as platinum and rhodium. Masking by means of said metals, is however, considerably less resistant to the high temperatures, for example of 1000°C or more, involved in the conventional oxidation treatments, in which for example wet oxygen is passed over the silicon body approximately at atmospheric pressure.

If a silicon body is locally provided with a silicon oxide layer by oxidation, the resultant patterned layer of silicon oxide is sunk over part of its thickness in the silicon body. It is preferred, however, to interrupt the oxidizing treatment at least once and to remove the silicon oxide layer already obtained during the interruption over at least part of its thickness, for example by etching. Thus the resultant layer-like pattern can be sunk into the silicon body over a much greater part of its thickness or even over the whole of its thickness.

As will be evident from the foregoing the invention is particularly important for the application of a thick patterned layer, for example having a thickness of at least 0.5 micron. Preferably a layer-like oxide pattern sunk over at least 0.5 micron of its thickness in the silicon body is applied.

Very important is any embodiment of the method according to the invention in which with the aid of the oxidation mask a patterned layer of silicon oxide with at least one opening is provided. Even if a thick oxide layer is employed, this opening may be very small since contrary to know methods the opening need not to be provided in the thick oxide layer by etching. The oxidation mask formed for example by a thin silicon nitride layer may be applied with the aid of photo-lithographic processes accurately in the form of one or more small spots. Moreover, the opening obtained is not a small deep opening rendering the establishment of a contact very difficult, since the oxide pattern is sunk in the silicon body.

The oxidation mask may be removed completely from the surface of the silicon body in the opening, to which surface in the opening a metal layer may be applied in order to obtain a Schottky-diode (a diode comprising a metal semiconductor junction) in which to permit the establishment of an electric contact said metal layer extends beyond the opening and over the silicon oxide layer.

According to a further embodiment the mask is removed from the surface of the silicon body in the opening and a pn-junction is provided by the diffusion of an impurity into said silicon body through the opening and a metal layer is applied to the exposed surface which metal layer extends beyond the opening over the silicon oxide layer in order to permit the establishment of an electric connection. In this manner a very small pn-diode can be obtained.

Because the oxide layer may be thick without causing difficulties the silicon oxide layer will provide satisfactory insulation between the conductor on the oxide layer and the semiconductor body, while during the connection of a conductor to the metal layer there is little risk of damaging the thick oxide layer.

A very important embodiment of the method according to the invention is characterized in that after removal of at least part of the mask from the surface of the silicon body in the opening a pn-junction is provided in the silicon body by the diffusion of an impurity in the exposed surface of the silicon body, said junction being located at a smaller depth from the surface than the depth over which the patterned layer is sunk in the silicon body. In this manner it is possible to obtain a substantially flat pn-junction, the plane of which is approximately parallel to the surfaces of the silicon oxide layer while it is yet bounded at the edge by the oxide layer. Thus the ion drift and the reduction of the breakdown voltage due to the strong curvature of the pn-junction plane referred to above are restricted.

Prior to the diffusion of the impurity the whole mask may be removed while after the application of the pn-junction and with the aid of a diffusion mask an impurity is diffused into part of the surface of the silicon body in the opening of the patterned layer for providing a second pn-junction at a smaller depth than the pn-junction already provided. This results in a planar npn- or pnp-transistor structure one of the pn-junctions of which is substantially flat.

Furthermore the mask may be removed only partly prior to the diffusion, while after the diffusion and after the application of a silicon oxide layer by an oxidizing process in the opening at the surface not covered by the remaining part of the mask, which oxide layer is thinner than the patterned layer and is sunk over at least part of its thickness in the silicon body, the remaining part of the mask is removed while in the exposed surface an impurity is diffused for obtaining a pn-junction which forms an extension of the pn-junction already provided, as well as an impurity for obtaining a second pn-junction at a smaller depth in the silicon body than the said extension, and than the depth over which the thinner oxide layer is sunk in the semiconductor body. It is thus possible to obtain a transistor structure having a substantially flat emitter junction and a base zone whose part located beneath the emitter zone is thinner than the remaining part of the base zone.

It is preferred to provide the patterned layer of silicon oxide with at least one metal layer which is connected in a usual way to a zone obtained by diffusion of an impurity, and to connect a conductor to said metal layer.

A very important embodiment of the method according to the invention for obtaining a monolithic semiconductor circuit comprising a silicon body, a surface of which is coated with an insulating layer on which layer a system of conductive tracks is applied, which system is connected through openings in the insulating layer to zones adjacent the insultating layer of at least two circuit elements provided in the silicon body, while the system of conductive tracks has at least one contact area for connecting a conductor to the system, is characterized in that the surface of the silicon body is provided with a patterned layer of silicon oxide, after which with the aid of an insulating layer applied to the surface part not coated by the pattern, this insulating layer being thinner than the pattern and being adjacent thereto, the zones of the circuit elements adjacent this insulating layer are provided in the silicon body, after which on the insulating layer consisting of the patterned layer and the thinner insulating layer the system of conductive tracks is provided, the contact areas of this system being provided on the patterned layer.

In the manufacture of monolithic semiconductor circuits it is often highly desirable to use a thin insulating layer for example of silicon oxide or of silicon nitride in which however, during the establishment of a connection between a conductor and a contact area of the system of conductive tracks on the insulating layer this thin insulating layer may be damaged so that a short circuit between the connecting conductor and the silicon body may occur. The insulating layer may also be damaged when the ready semiconductor device is tested, in which case contact pins are pressed against the contact areas. In practice, this causes a great amount of rejects. By using, in accordance with the invention, a patterned oxide layer to obtain an insulating layer having a thickened part at the area of the patterned layer and by providing the contact areas on the thick oxide pattern rejects may be avoided substantially completely.

The invention is furthermore important for the manufacture of semiconductor devices in which a silicon body is used, which is formed by a silicon layer applied to a support. In the silicon layer a plurality of circuit elements is often formed for producing an integrated circuit. If it is required to insulate the circuit elements from each other grooves are often made through the silicon layer between the circuit elements so that the silicon layer is subdivided. An essential disadvantage thereof is that the grooves introduce unevennesses in the device to be manufactured. The insulation may furthermore be obtained by providing two pn-junctions between the circuit elements. However, this may give rise to parasitic transistor action. A further important embodiment of the method according to the invention is characterized in that the starting silicon body consists of a silicon layer applied to a support, while the oxidizing process for obtaining the patterned layer of silicon oxide is continued until the patterned layer extends throughout the thickness of the silicon layer, the silicon layer being divided into a plurality of portions separated one from the other by the patterned layer. In said portions circuit elements may be provided, which are electrically insulated one from the other by the patterned layer.

The invention furthermore relates to a semiconductor device comprising a silicon body having a patterned layer of silicon oxide sunk in the said body over at least part of its thickness, manufactured by carrying out a method according to the invention.

Several embodiments of the method according to the invention will now be described with reference to the drawing.

FIGS. 1 to 4 show diagrammatically cross-sectional views of a Schottky diode in various stages of its manufacture by a method according to the invention.

FIG. 5 is a diagrammatic cross-sectional view of a pn-diode and

FIG. 6 a diagrammatic cross-sectional view of a transistor manufactured by a method according to the invention.

Figure 7:
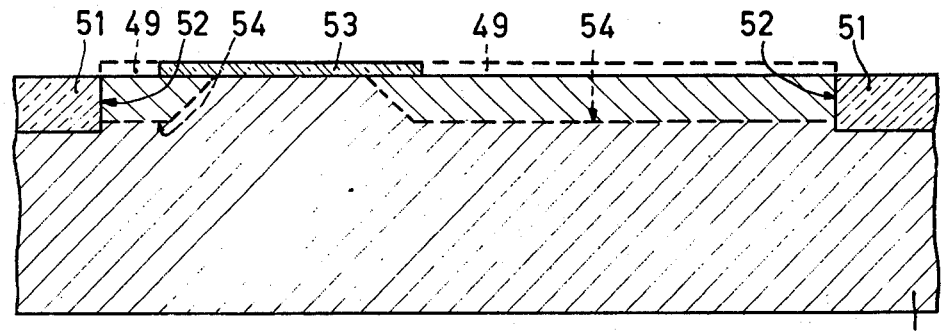
Figure 8:
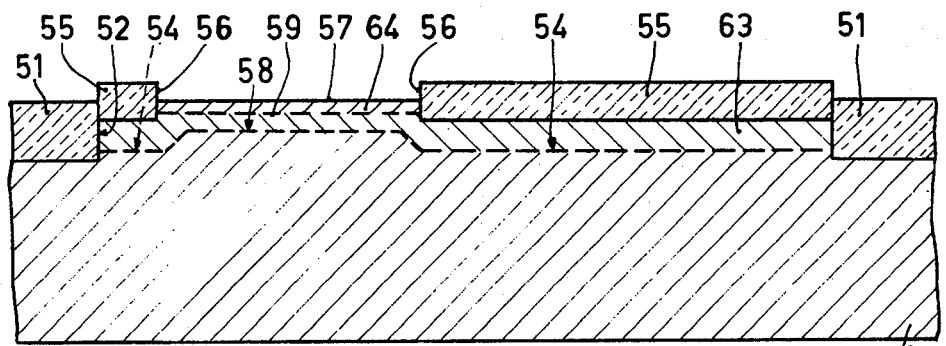
Figure 9:
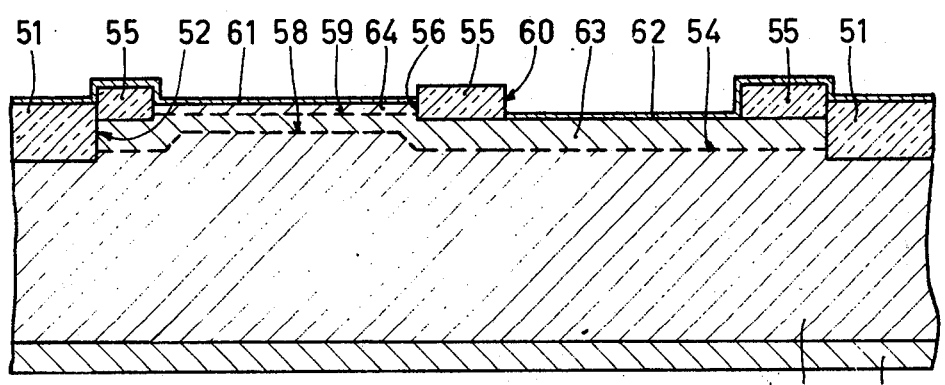

FIGS. 7 to 9 are diagrammatic cross-sectional views of a part of a semiconductor body in various stages of the manufacture by a method according to the invention, in which a transistor structure is provided.

Figure 10:
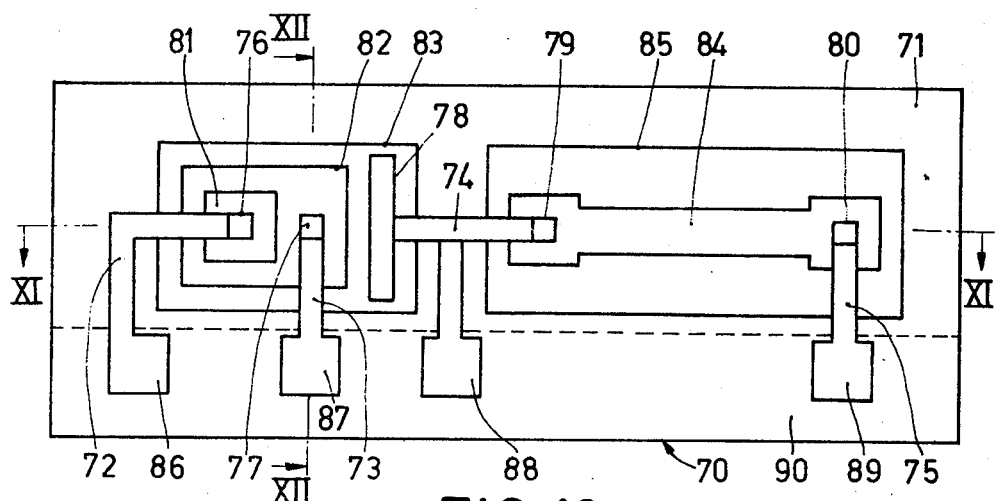

FIG. 10 is a diagrammatic plan view of a monolithic circuit manufactured by a method according to the invention.

Figure 11:
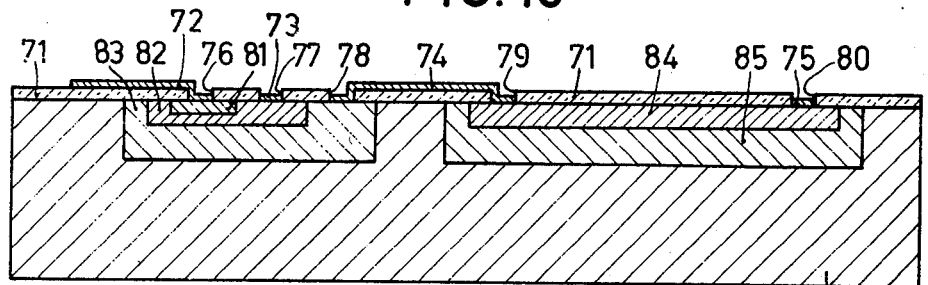

FIG. 11 is a diagrammatic cross-sectional view taken on the line XI—XI in FIG. 10.

Figure 12:
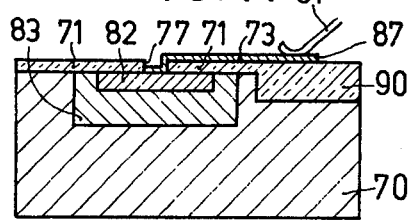

FIG. 12 is a diagrammatic cross-sectional view taken on the line XII—XII in FIG. 10.

Figure 13:
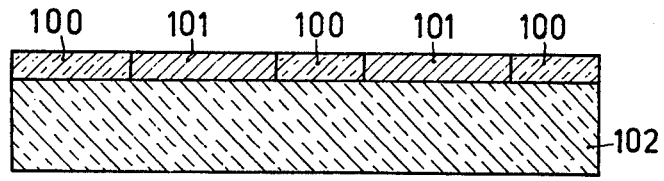

FIG. 13 is a diagrammatic cross-sectional view of a supporting body which supports a silicon layer provided with a patterned silicon oxide layer applied by a method according to the invention.

In the following embodiments use is made of the difference in etching speeds of silicon nitride, silicon oxide and a mixed oxide of lead and silicon (lead glass) in the following etchants:

Hydrofluoric acid (50%)
Etching speed of silicon nitride (applied to the silicon body by heating this body at about 1000°C in a gaseous mixture of $SiH_4$ and $NH_3$) about 0.3 A/sec.
Etching speed of silicon oxide about 300 A/sec.
In more diluted hydrofluoric acid the etching speeds are reduced.

P-etchant. This is an etching liquid consisting of 15 parts of hydrofluoric acid (50%), of 10 part of $HNO_3$ (70%) and of 300 parts of water.
Etching speed of silicon oxide about 2 A/sec.
Etching speed of lead glass about 300 A/sec.

EXAMPLE 1

This example relates to a method of manufacturing a semiconductor device 20 (see FIG. 4) comprising a silicon body 1 with a Schottky diode with a metal-semiconductor junction 11, 3 at the surface 10 of the silicon body 1, while a silicon oxide layer is provided for the Schottky diode. The substantially flat silicon oxide layer is obtained by an oxidizing process at the surface of the silicon body 1, and transformed into a patterned layer 8 of silicon oxide, after which the surface portion 10 not covered by the patterned layer is subjected to treatments in order to obtain the circuit element. In this embodiment this means the application of a metal layer 11 to obtain the Schottky diode.

In known methods, the surface of the silicon body is completely coated with a silicon oxide layer after which an opening is made in the oxide layer in order to obtain the pattern for example by etching, the metal-semiconductor junction being subsequently applied in the opening. According to the invention, a patterned layer of silicon oxide 8 is directly applied, which layer is sunk in the silicon body 1 over at least part of its thickness by locally masking the silicon surface against the oxidizing process.

The starting material is a single crystal silicon body 1 (See FIG. 1) consisting of n-type conductive silicon wafer 2 with a resistivity of about 0.01 ohm.cm and a thickness of about 200 micron, on which an n-type silicon layer 3 with a resistivity of about 1 ohm.cm and a thickness of about 4 micron is grown epitaxially.

The further dimensions of the silicon body are little critical. Usually the body 1 is chosen to have ample dimensions to permit of making a great number of circuit elements side by side, in one operation, whilst the separate circuit elements are obtained by subdividing the silicon body. For the sake of simplicity the manufacture of only one circuit element will be described hereinafter.

The layer 3 is provided with a mask formed by a layer 4, 5 of a material resistant to oxidation having a thickness which is smaller than that of the pattern 8 to be applied. It is preferred to apply a layer 4, 5 of silicon nitride. The silicon nitride layer 4, 5 may be applied in a conventional manner by heating the body 1 at about 1000°C in a gas mixture of $SiH_4$ and $NH_3$. The layer 4, 5 may have a thickness of about 0.1 micron.

In a conventional manner, for example by using a photo-lithographic method, the layer part is removed, so that an accurately defined and very small thin round disc 5 may be obtained.

Subsequently by passing steam having a pressure of 1 atm. over the body 1 at about 1100°C a silicon oxide pattern is applied. After two hours the oxidizing process is interrupted. An oxide layer 6 (FIG. 2) with a thickness of about 1 micron is then obtained which layer is sunk in the body 1 over about 0.5 micron surrounding a silicon mesa under the masking disc 5.

During the interruption of the oxidizing process the resultant oxide layer 6 is removed throughout its thickness by etching in hydrofluoric acid utilizing the oxidation mask 5 now as an etching mask and the large difference in etching rates of the oxide and nitride as previously described. Then the preceding oxidizing process is repeated and a 1 micron thick pattern of silicon oxide 8 (FIG. 3) consisting of a plane oxide layer having an opening 7, said pattern being sunk in the silicon body 1 over substantially its whole thickness, is obtained.

Then the body 1 is heated at a temperature of about 700°C for about 5 min. in the presence of a body of lead oxide held near the masking disc 5, for example at a distance of about 0.3 mm. The silicon nitride of the disc 5 is thus converted into lead glass. The resulting lead glass is dissolved by etching in said P-etchant for about 1 min.

The mask 5 is thus completely removed from the surface 10 of the body 1 in the opening 7 and this surface 10 is provided with a gold layer 11 in order to obtain the Schottky diode and in order to permit of extablishing an electric contact. This metal layer 11 extends also over the oxide layer 8. The metal layer 11 may have a diameter of 20 microns and may be applied in a conventional manner, for example by vapour deposition.

The electric connection to the layer 11 is established by fixing a conductor 12 to the gold layer 11 in known manner. This connection is facilitated by the substantial flatness of the gold layer 11, since the pattern 8 is sunk in the body 1.

The body 1 may be secured in a conventional manner, for example by soldering or alloying, to a metal supporting plate 13, which serves as a second electric connection for the Schottky diode.

EXAMPLE 2

A p-type silicon body having a resistivity of 25 ohm.cm and a thickness of about 200 microns is provided in the manner described in the preceding example with a pattern sunk in the silicon body 21 (FIG. 5) over substantially its whole thickness and formed by a flat silicon oxide layer 23 provided with an opening 22 and having a thickness of about 1 micron. The opening has in this case a diameter of about 100 micron and surrounds a silicon mesa.

In the manner described above, the nitride masking is removed from the surface 24 of the silicon body 21 in the opening 22 and by diffusion of an impurity into the surface 24 a pn-junction 25 is provided in the silicon body, after which a metal layer 26 is applied to the surface 24.

If the opening 22 is small, the metal layer 26, in the same way as described in the preceding example, may extend over the oxide layer 23 in order to provide a sufficiently large surface for the connection of a conductor.

The pn-junction 25 is located at a smaller depth from the surface 24 than the depth over which the pattern 23 is sunk in the silicon body 21. The pn-junction 25 is provided for example at a depth of 0.7 micron by a conventional phosphorus diffusion so that the n-type zone 28 is formed. This results in a substantially flat pn-junction 25, the edge of which is yet in contact with the oxide layer 23.

After the surface 24 is cleaned an aluminum contact layer 26 is applied in a conventional manner, for example by vapour deposition, so that a substantially ohmic contact is obtained. The body is fastened in a conventional manner to a metal plate 27 which also constitutes a contact. A conductor may furthermore be connected to the contact layer 26. Thus a pn-diode is obtained.

Diodes manufactured by this method have a breakdown voltage of about 200 volt whereas diodes made from the same material in the conventional manner, subjected to the same thermal treatments (oxidations, diffusions), have a break-down voltage of not more than 100 volts.

The difference in break-down voltages is due to the fact that the diodes according to the invention have a substantially flat pn-junction whereas the diode made by the conventional planar technique has a curved, cup-shaped pn-junction.

EXAMPLE 3

An npn- or pnp-transistor structure may be obtained as follows:

After the nitride masking is removed from the surface 34 (FIG. 6) of the silicon body 31, in the opening 33 of the sunken oxide pattern 32 and after the application of the substantially flat pn-junction 35 in the manner described in the preceding example, the surface 34 is provided with a diffusion mask. This diffusion mask may be formed by a silicon oxide layer 41 having a thickness of about 0.3 micron and having an opening 37. This diffusion mask may be applied in a conventional manner. By diffusion of an impurity through the opening 37, the second pn-junction 36 is formed at a smaller depth than the pn-junction 35 already formed, the result being the pnp- or npn-structure. In the manner known in the planar technique, the oxide layer 32 is provided with metal layers 40 and 39 which are connected through openings 38 and 37 to the diffused zones 46 and 45, bounded by the pn-junctions 35 and 36, whilst the conductors 44 and 43 are connected to the metal layers 40 and 39. The body 31 is fastened to the metal plate 42 which serves as a contact. The transistor structure has a substantially flat pn-junction 35, which may serve as a collector or emitter junction whilst the pn-junction 36 serves as an emitter or a collector junction respectively.

The parts of the semiconductor body 31 accommodating the junctions 35 and 36 may be a silicon layer grown epitaxially whilst the pattern 32 may extend throughout the thickness of this layer. The structure corresponding with an epitaxial mesa-structure can then be obtained. In the case of a transistor, the silicon oxide pattern 32 may advantageously have a greater thickness (for example 2 micron) than in the case of a diode so that the flat junction may be at a greater depth, there being left more space for the accommodation of a second pn-junction.

Since the metal layers 39 and 40 extend substantially over the thick pattern 32, the capacitance between these metal layers and the body 31 is small.

EXAMPLE 4

It will now be described how with the aid of a method according to the invention a transistor can be obtained, which has a substantially flat emitter junction, and a base zone whose portion lying beneath the emitter zone is thinner than the remaining part of the base zone. In a manner similar to that described in the preceding examples the silicon body 50 (FIG. 7) is provided with a sunken pattern formed by a silicon oxide layer 51 having an opening 52, in which the masking layer 49, 53 of silicon nitride is used. The oxidation may be done by other conventional oxidizing treatments in addition to the use of wet oxygen, namely, the use of dry oxygen, or in general any oxidizing treatment in which the oxide is grown into the body. Then the masking is partly removed, so that a disc-shaped portion 53 of the masking 49, 53 is left.

This may be carried out as follows: Part 53 is coated in a conventional manner with an aluminum layer having a thickness of about 0.1 micron. Then the part 49 of the layer 53 is removed in high vacuum by a sputtering method known in the art. The pattern 51 thus becomes slightly thinner. Aluminum is then removed from the part 53 by etching in nitric acid.

The pattern 51 may have a thickness of about 2 micron. By diffusion in a conventional manner of an impurity into the body 50, the pn-junction 54 is provided for example at a depth of 1.5 micron. By oxidizing at the places not covered by the mask 53, a silicon oxide layer 55 (see also FIG. 8) is provided in the opening 52 on the surface not covered by the nitride mask 53. The oxide layer 55 is thinner than the pattern 51 and may have a thickness of 1 micron and is sunk in the silicon body 50 over about 0.5 micron. Thus the oxide layer 55 forms a pattern sunk in the body over half its thickness and having an opening 56.

The nitride mask 53 is removed in the manner described above and in the exposed surface 57 an impurity is diffused to obtain a pn-junction 58, which forms an extension of the pn-junction 54 already provided. The pn-junction 58 may lie at a depth of about 0.6 micron. Furthermore an impurity is diffused in a conventional manner in order to obtain a second pn-junction 59 at a smaller depth for example of about 0.3 micron in the body 50 than the extended pn-junction 54, 58, said depth being smaller than that over which the oxide layer 55 is sunk in the silicon body 50.

After cleaning of the opening 56 and after the provision of the opening 60 (FIG. 9) in a conventional manner, the emitter contact layer 61 and the base contact layer 62 are provided for example by depositing aluminum from the vapor phase. On the bottom side of the body 50 a collector contact 66 may be provided. Conductors may be connected to the parts of the metal layers 61 and 62 extending over the thick pattern 51.

The resultant transistor has a substantially flat pn-junction 59 and a base zone 63 having a thin portion lying beneath the emitter zone 64.

In this manner transistors can be obtained which are suitable for high frequencies and have a low base series resistance, in which the contact layers 61 and 62 extend over the thick pattern 51 so that the capacitance between these contact layers and the body 50 is small.

EXAMPLE 5

This example relates to a method for the manufacture of a monolithic semiconductor circuit having a silicon body 70 (FIGS. 10, 11 and 12) one surface of which is coated with an insulating layer 71, 90 on which a system of conductive tracks 72 to 75 is provided, which are connected through openings 76 to 80 in the insulating layer 71 to zones 81 to 84 adjacent the insulating layer 71 and associated with two circuit elements, that is to say, a transistor with emitter, base and collector zones 81, 82 and 83 respectively, and a resistance element having a zone 84. The zone 85 is provided in a conventional manner only for insulation purposes. The system of conductive tracks 72 to 75 comprises contact areas or pads 86 – 89, to permit the connection of conductors to the system. For the sake of clarity, only in FIG. 12 a conductor is shown namely the conductor 91 which is connected to the contact area 87.

According to the invention, first the surface of the silicon body 70 is provided with a patterned layer of silicon oxide 90 which is preferably sunk throughout its thickness in the silicon body 70. The pattern 90 which has the shape of a strip may have a thickness of at least 1 micron.

In a manner conventional in the planar semiconductor technique and with the aid of an insulating layer 71 which is thinner than the pattern 90 and is adjacent the pattern 90, the said transistor and resistance elements are provided. The zones 83 and 85 may be provided prior to the application of the insulating layer 71, 90 whereas the zones 81, 82 and 84 are applied after the insulating layer 71, 90 is provided. The thin insulating layer 71 may have a thickness of about 0.4 micron. Such a small thickness is often used in the planar semiconductor technique for an insulating layer. Then the system of conductive tracks 72 to 75 is applied in a conventional manner while the contact areas 80 to 89 are applied on the thick oxide pattern 90. The conductive tracks with the contact areas are usually made of aluminum and it is practically unavoidable that a thin aluminum oxide layer is formed on the aluminum. In the conventional manufacturing process the resultant semiconductor device is tested by pressing contact pins to contact areas 86 to 89 with a sufficient force to penetrate the aluminum oxide layer. Thus an insulating layer lying beneath the contact areas having a conventional thickness for example about 0.4 micron is likely to be damaged. The thick pattern 90 reduces the risk of such a damage. Moreover the risk of damage is much smaller when the conductors (91) are connected to the contact areas (87). For a number of circuits it is furthermore important that the capacitance between the silicon body 70 and the contact areas 86 - 89 should be small owing to the thick pattern 90.

The thin insulating layer 71 consists of silicon oxide and may be applied in a conventional manner after the removal of the nitride masking, which is used in a manner described above for the application of the pattern 90, for protecting the silicon surface locally against the oxidation. The thin layer 71 may also consist of this masking material, for example if this mask consists of silicon nitride.

It will be obvious that more and/or other circuit elements such as diodes and field effect transistors may be provided in the silicon body. The oxide pattern 90 may have quite different shapes and may be formed by a ring surrounding the thin insulating layer, while its contact areas are distributed over this ring. The thick oxide pattern may furthermore extend beneath a conductive track which may be useful when the capacitance between the track and the silicon body has to be small.

EXAMPLE 6

Nowadays semiconductor devices are often made from a starting silicon body formed by a silicon layer applied to a support. The support usually consists of insulating material, for example $Al_2O_3$. The silicon layer which may be polycrystalline or substantially monocrystalline, may be applied to the support by the deposition of silicon. A number of circuit elements such as diodes, field effect transistors of the type having an insulated gate electrode, and resistors may be provided in the silicon layer. The silicon layer may be provided with an insulating layer, for example of silicon oxide, on which a system of conductive tracks connected to the circuit elements is provided in a manner as described in the preceding example.

The circuit elements in the silicon layer may be insulated electrically one from the other by a pattern of grooves etched in the layer, the layer being subdivided into a plurality of portions each of which may contain a circuit element. This has the disadvantage that owing to the grooves the surface of the device is no longer flat while such grooves may give rise to electric leakage paths.

If the layer is of the one conductivity type the insulation may be obtained by applying a pattern of zones of the opposite conductivity type extending throughout the thickness of the layer, the layer being thus divided into a plurality of portions of the one conductivity type which may contain a circuit element and which are separated one from the other by the zones of the opposite conductivity type. In this case, however, the zones of the opposite conductivity type may give rise to a parasitic transistor action.

By means of a method according to the invention, the electric insulation is provided so that said disadvantages are avoided. The silicon layer on the support is provided with a patterned layer of silicon oxide in a manner as described in the preceding examples. During this process the oxidizing treatment is continued until the pattern extends throughout the thickness of the silicon layer, the silicon layer being divided into a plurality of portions separated one from the other by the patterned layer of silicon oxide.

Referring to FIG. 13, the patterned layer of silicon oxide is designated by 100 the portions of the silicon layer separated from each other by said pattern by 101 and the support by 102.

In the portions 101 circuit elements may be provided in a conventional manner while the unit may be coated with an insulating layer having a system of conductive tracks.

It will be obvious that the invention is not restricted to the examples described above and that within the scope of the invention many variants are possible to those skilled in the art.

The layer-like pattern of silicon oxide need not be sunk in the silicon body throughout its thickness. For applications it will be sufficient for the pattern to be sunk in the silicon body over at least half its thickness. The pn-junctions of, for example, a high frequency transistor may be applied at greater depths than the depths over which the pattern is sunk. Then no flat pn-junctions are obtained, but it is not necessary to provide small openings in a thick oxide layer after it has been grown while the metal layers to which conductors have to be fastened, can yet lie on a thick oxide layer (the pattern), so that the capacitance between these metal layers and the body is small. In order to obtain a pattern sunk in the silicon body practically throughout its thickness, the oxidizing treatments may be interrupted more than once in order to remove the resultant oxide layer over at least part of its thickness.

Moreover, prior to the application of the oxide pattern, the silicon body may be subjected to an etching treatment at the areas where the oxide pattern has to be provided.

What is claimed is:

1. A method for the fabrication of a semiconductor device comprising the steps of:

a. forming on one surface of a substrate comprising monocrystalline silicon a masking layer comprising a masking material other than silicon oxide which is effective to prevent oxidation of the underlying silicon during a thermal oxidation treatment;

b. removing a selected portion of said masking layer, thereby selectively exposing a portion of the surface of said substrate;

c. selectively removing a thin layer of silicon adjacent said exposed surface by thermally oxidizing silicon adjacent said exposed surface and then removing at least part of the thickness of the oxide layer thus formed without removing the remainder of said masking layer, thereby leaving a portion of said substrate beneath the masking layer in the form of a mesa;

d. selectively oxidizing the surface of said substrate remaining after removal of said thin layer to form a second oxide layer having an upper surface substantially coplanar with the top of said mesa;

e. removing the remainder of said masking layer thereby leaving the surface of said mesa exposed, said mesa being surrounded by the coplanar second oxide layer produced by the latter oxidizing step.

2. A method as defined in claim 1, wherein said masking layer comprises silicon nitride.

3. A method as defined in claim 2, wherein the oxide layer formed during the first thermal oxidation step is completely removed prior to the formation of the second oxide layer.

4. A method as claimed in claim 1 wherein the monocrystalline silicon constitutes an epitaxial layer on a support, and the formed second oxide layer extends at least partly through the epitaxial layer.

5. A method of fabricating a semiconductor device comprising the steps of:

forming on the surface of the epitaxial layer of a body which includes a semiconductive epitaxial layer on a semiconductive bulk portion a first mask of a material having the characteristics that it resists etching in a first ambient which etches the semiconductor material, it inhibits oxidation of the underlying semiconductor material during a subsequent step in which the unmasked portion of the surface is oxidized, and it is removable by etching in a second ambient which attacks the mask but does not appreciably attack the grown oxide of the semiconductor material;

immersing the body in the first ambient so that the unmasked portions of the surface of the epitaxial layer are removed by etching at least partially through the epitaxial layer to form a mesa;

exposing the body at an elevated temperature to a third ambient sufficient to oxidize the unmasked portion of the epitaxial layer for a time sufficient that the oxide grown there extends essentially completely through the epitaxial layer and planarity is substantially restored to the surface of the body;

removing the mask from the surface to expose the portions of the surface thereunderlying; and introducing impurities into the exposed semiconductor portions to modify the conductivity therein, this last-mentioned step using the aforementioned grown oxide as a second mask for enabling selective introduction of impurities into the exposed semiconductor regions.

6. A method as recited in claim 5 wherein the impurities introduced into the exposed semiconductor portions are of a type and amount sufficient to form in the mesa a plane rectifying junction which intersects the sides of the mesa where such sides are covered by the grown oxide.

7. A method as recited in claim 5 wherein the resistivity of the epitaxial layer is different from the resistivity of the bulk portion.

8. A method as recited in claim 5 wherein the material for said mask is silicon nitride.

9. The method recited in claim 5 further characterized in that the semiconductor material is silicon.

10. The method recited in claim 7 further characterized in that the material for said first mask is selected from the group consisting of silicon nitride and aluminum oxide.

11. The method recited in claim 9 further characterized in that the semiconductor body comprises a low resistivity substrate and a higher resistivity epitaxial layer thereon.

12. The method recited in claim 11 further characterized in that the introduced impurities convert at least a portion of the epitaxial layer to a zone of conductivity type opposite to that of the epitaxial layer.

13. The semiconductor device fabricated according to claim 5.

14. A method of manufacturing a semiconductor device, comprising providing a semiconductor body portion of silicon, covering a selected area of the semiconductor body portion with an oxidation masking layer comprising a masking material other than silicon oxide and capable of preventing the underlying silicon from oxidizing when the body portion is subjected to an oxidizing treatment leaving unmasked silicon surface areas in a pattern corresponding to a desired oxide pattern, subjecting the silicon body portion to a silicon material-removing treatment to remove silicon from the areas where the oxide pattern is desired by using a selective silicon material-removal treatment by which the oxidation masking material is substantially not attacked, subjecting the silicon body portion to an oxidizing treatment while the selected area remains masked causing a patterned oxide of silicon to grow into the silicon at the unmasked portions and until planarity is substantially restored to the surface of the body portion and a masked silicon mesa surrounded by the oxide is formed, and thereafter removing the oxidation masking material from said mesa by a selective material removal treatment by which the previously-formed oxide pattern is substantially not attacked.

15. A method as claimed in claim 14, wherein the silicon material-removal treatment comprises an etching treatment.

16. A method of manufacturing a semiconductor device as claimed in claim 14, wherein the silicon body portion is provided as a layer on a support, and the oxidation masking layer is patterned to provide plural separated masked silicon surface areas which are formed into plural silicon mesas separated by the patterned oxide formed during the oxidizing treatment.

17. A method as claimed in claim 14, wherein the masking material is silicon nitride.

18. A method as claimed in claim 14, wherein the semiconductor body portion comprises an epitaxial layer, and the patterned oxide extends at least partly through the epitaxial layer.

19. A method of manufacturing a semiconductor device, comprising providing a semiconductor body portion of silicon, covering a selected area of the semiconductor body portion with an oxidation masking layer comprising a masking material other than silicon oxide and capable of preventing the underlying silicon from oxidizing when the body portion is subjected to an oxidizing treatment leaving unmasked silicon surface areas in a pattern corresponding to a desired oxide pattern, subjecting the silicon body portion to an oxidizing treatment while the selected area remains masked causing a patterned oxide of silicon to grow into the silicon at the unmasked portions and a masked silicon mesa surrounded by the oxide pattern is formed, removing the oxidation masking material from the mesa surface by a selective material-removal treatment by which the oxide pattern is substantially not attacked, and applying to the mesa an electrode comprising a layer which forms a Schottky barrier with the silicon, said electrode also extending over the oxide pattern beyond the mesa.

20. A method as claimed in claim 19, wherein the masking material is silicon nitride.

21. A method of manufacturing a semiconductor device, comprising providing a semiconductor body portion of silicon, covering a selected area of the semiconductor body portion with an oxidation masking layer comprising a masking material other than silicon oxide and capable of preventing the underlying silicon from oxidizing when the body portion is subjected to an oxidizing treatment leaving unmasked silicon surface areas in a pattern corresponding to a desired oxide pattern, subjecting the silicon body portion to an oxidizing treatment while the selected area remains masked causing a patterned oxide of silicon to grow into the silicon at the unmasked portions and a masked silicon mesa surrounded by the oxide pattern is formed, removing from a part of the mesa bordering the oxide pattern a part of the oxidation masking layer by a material removal treatment that attacks the masking layer but does not substantially attack the oxide pattern, and introducing inpurities into said mesa part using the oxide pattern together with the remaining part of the oxidation masking layer to mask the underlying silicon against introduction of impurities.

22. A method as claimed in claim 21, wherein the masking material is silicon nitride.

23. A method of manufacturing a planar monolithic integrated circuit, comprising providing a semiconductor body having on a surface of said body a silicon oxide layer having thicker and thinner parts with the thicker part extending into said body below the thinner part but not completely through the body; said thicker oxide layer part being formed by covering a selected area of the body surface with an oxidation masking layer comprising a masking material other than silicon oxide and capable of preventing the underlying silicon from oxidizing when it is subjected to an oxidizing treatment leaving an unmasked surface area in a pattern corresponding to the desired thicker oxide layer part, and subjecting the silicon body portion to an oxidizing treatment while the selected area remains masked causing a patterned oxide of silicon to grow into the silicon at the unmasked portions and until the grown oxide pattern is thicker than the masking layer and forms the desired thicker oxide layer part; thereafter removing the oxidation masking material by a selective material removal treatment by which the thicker oxide layer part is substantially not attached; said thinner oxide layer part being formed on the remaining surface part not covered by the thicker oxide layer part; providing zones of circuit elements in the silicon body and adjacent said remaining surface part; forming through-holes in the thinner oxide layer part over circuit element zones, forming contact areas on the thicker oxide layer part, and forming a system of conductive tracks on the silicon oxide layer extending from the said contact areas and connected to zones of the circuit elements through the holes in the thinner oxide layer part.

24. A method as defined in claim 23, wherein said masking layer comprises silicon nitride.

25. A method of fabricating a semiconductor device comprising the steps of:
   forming on the epitaxial layer of a body which includes a semiconductive epitaxial layer on a semiconductive bulk portion a first mask having the characteristics that it resists removal in a first treatment which removes the semiconductor material, it inhibits oxidation of the underlying semiconductor material during a subsequent step in which the unmasked portion of the surface is oxidized, and it is removable by a second treatment which attacks the mask but does not appreciably attack the grown oxide of the semiconductor material;
   subjecting the body to the first treatment so that the unmasked portions of the surface of the epitaxial layer are removed at least partially through the epitaxial layer to form a mesa;
   exposing the body at an elevated temperature to an ambient sufficient to oxidize the unmasked portions of the epitaxial layer for a time sufficient that the oxide grown there extends essentially through the epitaxial layer and planarity is substantially restored to the surface of the body;
   removing the first mask from the mesa and
   introducing impurities into the mesa to modify the conductivity therein, this last-mentioned step using the aforementioned grown oxide as a second mask for enabling selective introduction of impurities into the mesa.

26. A method as recited in claim 25 wherein the impurities introduced into the mesa are of a type and amount sufficient to form in the mesa a plane rectifying junction which intersects the side of the mesa where such sides are covered by the grown oxide.

27. A method as recited in claim 25 wherein the resistivity of the epitaxial layer is different from the resistivity of the bulk portion.

28. A method as recited in claim 25 wherein the material for said mask is silicon nitride.

29. The method recited in claim 25 further characterized in that the semiconductor material is silicon.

30. The method recited in claim 29 further characterized in that the semiconductor body comprises a low resistivity substrate and a higher resistivity epitaxial layer thereon.

31. The method recited in claim 30 further characterized in that the introduced impurities convert at least a portion of the epitaxial layer to a zone of conductivity type opposite to that of the epitaxial layer.

32. The method recited in claim 25 wherein the first treatment comprises a selective etching step, and the mask removal step comprises a selective etching step.

33. A method for the farbrication of a semiconductor device comprising the steps of:
   a. introducing conductivity-modifying impurities into a selected part of the surface of a silicon body,
   b. forming an oxidation mask comprising silicon nitride over said silicon surface but not covering said selected surface part,
   c. subjecting the silicon body to an oxidation treatment causing a patterned layer of silicon oxide to grow into the silicon around said oxidation mask forming a silicon mesa underneath the oxidation mask and surrounded by the oxide pattern and underneath and adjacent the oxide pattern a region doped with said introduced impurities,
   d. thereafter removing the silicon nitride by subjecting same to a material-removal treatment without causing any substantial removal of the oxide pattern, and
   e. thereafter forming an electrode over the surface of the silicon mesa for utilizing the mesa in the fabricated device.

34. A method for the fabrication of a semiconductor device comprising the steps of:
   a. covering a limited area of a surface of a semiconductor silicon body with a masking layer comprising silicon nitride and capable of preventing the underlying silicon from oxidizing when the body portion is subjected to an oxidizing treatment and also capable of masking the underlying silicon against the introduction of impurities,
   b. introducing impurities into the surface of the body surrounding said masking layer using said masking layer as an impurity-introduction mask and subjecting the silicon body to an oxidizing treatment using said masking layer as an oxidation mask causing a patterned silicon oxide layer to grow into the silicon around said masking layer forming a silicon mesa under the oxidation mask and surrounded by the oxide pattern and bordering said oxide pattern a region of the silicon body doped with said introduced impurities,
   c. thereafter removing the silicon nitride by subjecting same to a material-removal treatment without causing any substantial removal of the surrounding oxide pattern, and
   d. thereafter forming an electrode over the surface of the silicon mesa as part of the fabricated device.

35. A method as claimed in claim 34, wherein the oxidizing treatment is continued until the grown oxide pattern is thicker than the masking layer.

36. A method as claimed in claim 34, wherein the electrode is formed to extend over the oxide pattern and into electrical connection with the silicon mesa.

37. A method as claimed in claim 34, wherein impurities are introduced into the silicon mesa forming a second doped region therein.

38. A method as claimed in claim 37, wherein the impurities are introduced into the silicon mesa using the surrounding oxide pattern as an impurity-introduction mask.

* * * * *

UNITED STATES PATENT AND TRADEMARK OFFICE
CERTIFICATE OF CORRECTION

PATENT NO. : 3,970,486
DATED : July 20, 1976
INVENTOR(S) : ELSE KOOI

It is certified that error appears in the above-identified patent and that said Letters Patent are hereby corrected as shown below:

Col. 6, line 24, after "pattern" insert -- , --(a comma);

line 40, change "whilst" to --while--;

Col. 8, line 33, change "whilst" to --while--;

line 35, change "the" to --a--;

line 38, change "whilst" to --while--;

line 42, change "whilst" to --while--;

line 57, after "obtained" delete " , " (the comma);

line 64, delete "the" and insert --an oxidation--;

Col. 9, line 1, after "masking" insert --49--; delete "partly";

Col. 10, lines 34 and 35, delete the parentheses "( )";

Col. 11, line 34, after "100" insert -- , --(a comma);

line 46, after "For" insert --some--;

UNITED STATES PATENT AND TRADEMARK OFFICE
CERTIFICATE OF CORRECTION

PATENT NO. : 3,970,486

DATED : July 20, 1976

INVENTOR(S) : ELSE KOOI

It is certified that error appears in the above-identified patent and that said Letters Patent are hereby corrected as shown below:

Claim 23, line 22, change "attached" to --attacked--;

Claim 25, line 24, before "and" insert -- ; --(a semi-colon).

Signed and Sealed this

Ninth Day of November 1976

[SEAL]

Attest:

RUTH C. MASON
*Attesting Officer*

C. MARSHALL DANN
*Commissioner of Patents and Trademarks*